United States Patent
Lauer

(10) Patent No.: US 7,027,532 B2
(45) Date of Patent: Apr. 11, 2006

(54) VITERBI DECODING WITH CHANNEL AND LOCATION INFORMATION

(75) Inventor: Joseph Paul Lauer, Mountain View, CA (US)

(73) Assignee: Broadcom Corporation, Irvine, CA (US)

(*) Notice: Subject to any disclaimer, the term of this patent is extended or adjusted under 35 U.S.C. 154(b) by 784 days.

(21) Appl. No.: 10/027,824

(22) Filed: Dec. 20, 2001

(65) Prior Publication Data

US 2003/0118133 A1 Jun. 26, 2003

(51) Int. Cl.
*H04L 5/12* (2006.01)

(52) U.S. Cl. .................. 375/341; 375/261

(58) Field of Classification Search ............ 375/262, 375/265, 340, 341, 261, 298; 714/794, 795
See application file for complete search history.

(56) References Cited

U.S. PATENT DOCUMENTS

| | | | | |
|---|---|---|---|---|
| 5,508,752 A * | 4/1996 | Kim et al. | ........... | 348/608 |
| 5,654,986 A * | 8/1997 | Lim | ........... | 375/341 |
| 6,421,394 B1 * | 7/2002 | Tanrikulu | ........... | 375/261 |
| 6,463,031 B1 * | 10/2002 | Tran | ........... | 370/203 |
| 6,792,055 B1 * | 9/2004 | Hart | ........... | 375/345 |
| 6,928,120 B1 * | 8/2005 | Zhang | ........... | 375/260 |

FOREIGN PATENT DOCUMENTS

| | | |
|---|---|---|
| EP | 0 465 428 A | 1/1992 |
| WO | WO 00/33500 | 6/2000 |
| WO | WO 01/78241 A2 | 10/2001 |

* cited by examiner

*Primary Examiner*—Emmanuel Bayard
(74) *Attorney, Agent, or Firm*—Christie, Parker & Hale, LLP.

(57) ABSTRACT

A method for exploiting location information inherent in the location of points within a transmitted signal constellation. A common method for assigning weights to branch metrics in a Viterbi decoder is to assign Hamming weights which are summations of the number of places in which a received bit pattern differs from the bit pattern assigned to a branch metric. Signal strength information may be incorporated into the weight assigned to a branch metric in the Viterbi decoder. Additionally information-inherent in the location of the points within a constellation may be taken into account. Bit errors which require a larger deviation to occur are given higher weights, and bit errors which require less deviation to occur are given lower weights. By taking into account signal strength and location information up to 2 dB of coding gain can be realized.

19 Claims, 17 Drawing Sheets

16 QAM

| Hard Decision | $k_{MSB}$ | $k_{LSB}$ |
|---|---|---|
| 00 | 3 | 1 |
| 01 | 1 | 1 |
| 11 | 1 | 1 |
| 10 | 3 | 1 |

703

VITERBI DECODING WITH CHANNEL AND LOCATION INFORMATION

FIELD OF THE INVENTION

The invention relates to methods used to decode convolutionally coded data, and in particular embodiments to methods of improving Viterbi decoding.

BACKGROUND OF THE INVENTION

Viterbi decoding is commonly used as a technique for recovering the most likely sequence of information bits that have been encoded with convolutional coding and degraded by transmission through a communication channel. A Viterbi decoder uses a trellis diagram representation of the convolutional code, to model the code as a set of states and branches. At a time n, the code occupies state $S_n$. The branches of the trellis diagram denote allowable transitions between states. In Viterbi decoding, a metric is associated with each state and each transition between states (branch). The metric reflects the likelihood of the code occupying that state at that time instant given the received bits. In general, a higher metric value implies that a state is less likely at that time instant, although lower values for less likely states equivalently may be used. Using the state metric at time n−1, the metric for each possible next state at time n is computed by the three step Viterbi algorithm. In the three step Viterbi algorithm the path metrics, which represent the likelihood of entering a state from an allowable path, are added. The path metrics for various paths are compared and the lowest metric is then selected as the most probable path. Using this add, compare select algorithm, a Viterbi decoder can determine the most likely sequence of information bits by tracing the sequence of branches, having the maximum likelihood, leading to a particular state. Viterbi decoding, while simpler than iterative forms of decoding such as MAP (Maximum A Posteriori) or soft Viterbi decoding, in general does not perform as well. There is therefore a need in the art for improved Viterbi decoding which is less complex than the iterative forms of decoding.

SUMMARY OF EMBODIMENTS OF THE INVENTION

In one aspect of the invention, the disclosure illustrates a method for taking into account the geometry of a signal constellation, which makes some bits more error prone than others. The chances of a bit being in error are dependent on the location of the bit with respect to other bits in the constellation. If adjacent constellation points have the same bit value in a particular location, they are less likely to be in error than if the constellation had adjacent bits with opposite values. More of a deviation is necessary to create an error in the first case, where adjacent symbol constellation points have the same value. A given amount of noise deviation in the first case may not create an error, whereas in the second case the exact same amount of noise deviation may create an error. This fact may be reflected in the branch metrics used by a Viterbi decoder, resulting in an improvement in decoder performance.

In another aspect of the invention, the signal to noise ratio (SNR) of a signal being received is used, in addition to information about the point location within the constellation, to scale the branch metrics so that the decoding more accurately models the actual channel performance. In addition to modeling more accurately the location information by scaling the branch metrics, further scaling of the branch metrics, according to the SNR, may further enhance decoding capability.

In one embodiment of the invention a method for Viterbi decoding is disclosed. A sampled signal is received. A hard decision is made on which constellation point the sampled signal represents. A scaling factor (k) is determined corresponding to the hard decision point, and the scaling factor (k) and the hard decision is provided to a Viterbi decoder In another embodiment of the invention a method of signal decoding is disclosed. A received signal is accepted. The received signal is quantized to a point in a signal constellation plane, to provide a quantized point. A hard decision is made as to which constellation point the quantized point represents. Scaling factors (ks) associated with each constellation point are determined. The scaling factors and hard decision point are used to determine decoder metrics and decoder metrics and quantized points are provided to a Viterbi decoder.

BRIEF DESCRIPTION OF THE DRAWINGS

The features, aspects, and advantages of the present invention, which have been described in the above summary, will be better understood with regard to the following description, appended claims, and accompanying drawings where:

DETAILED DESCRIPTION OF EMBODIMENTS OF THE INVENTION

Accordingly, the listed figures, specification and accompanying claims illustrate various embodiments of the invention in order to teach the inventive concepts of the invention disclosed herein.

Figure 1:
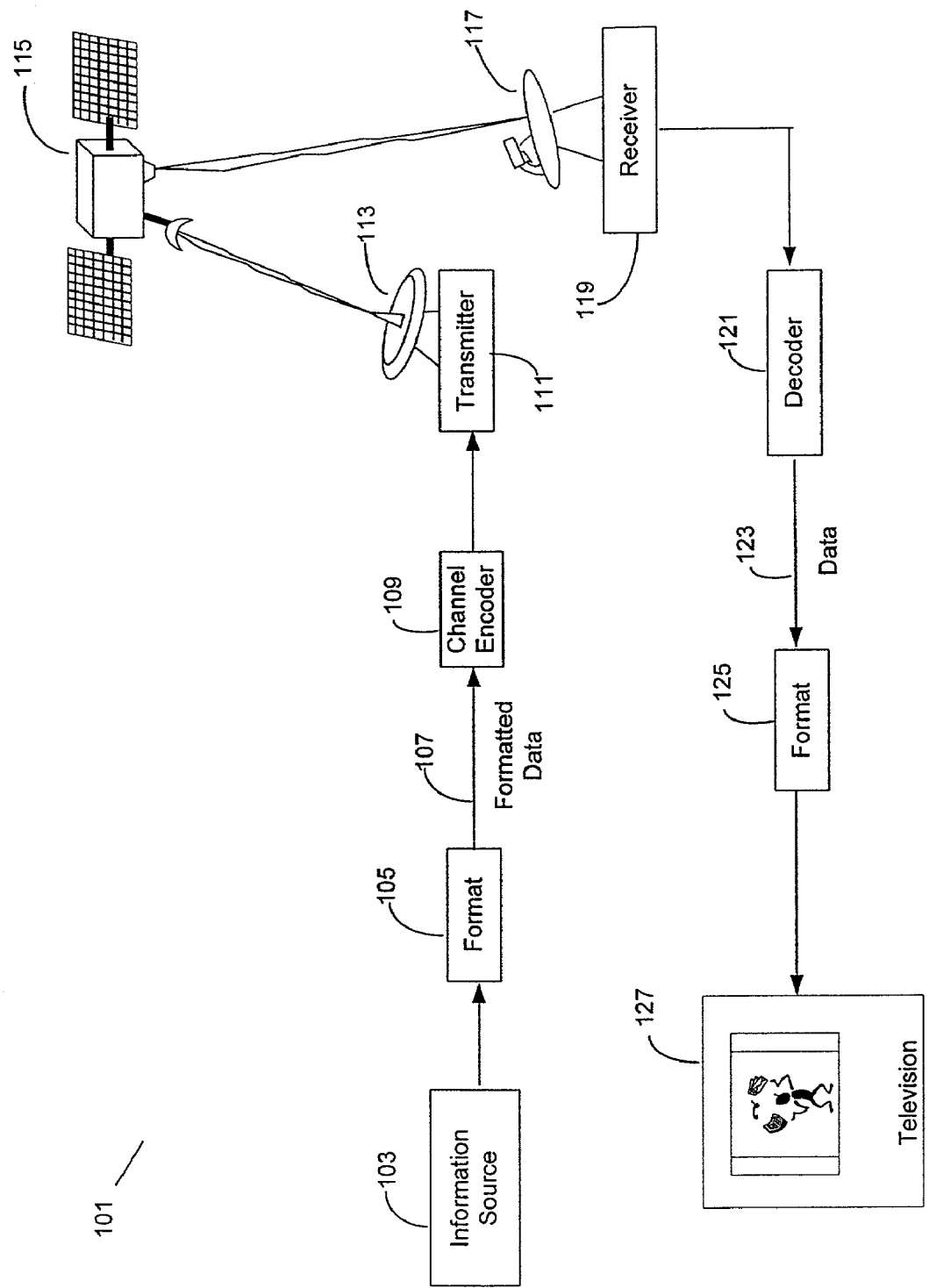
FIG. 1 is a graphical illustration of an environment in which embodiments of the present invention may be used.

FIG. 1 is a graphical illustration of an environment in which embodiments of the present invention may operate. The environment illustrated at 101 is a data distribution system, such as may be found in a cable television distribution system.

In FIG. 1 data is provided to the transmission system by an information source 103. For purposes of illustration, the information source displayed in FIG. 1 may be considered to be a cable television system head end, which provides video data to end users. Embodiments of the invention, however, are not limited to any particular type of information source and any other data source could be equivalently substituted.

A formatter 105 accepts data from information source 103. The data provided by information source 103 may comprise analog or digital signals such as (but not limited to) video signals, audio signals, and data signals. Formatter block 105 formats received data into an appropriate form, such as the data illustrated at 107. The formatted data 107 is then provided to a channel encoder 109. Channel encoder 109 encodes the formatted data 107 provided to it. In some embodiments of the present invention, the channel encoder 109 may provide an encoding for improving performance over the channel.

Channel encoder 109 provides encoded data to a transmitter 111. Transmitter 111 transmits the encoded data provided by channel encoder 109, for example, using an antenna 113. The signal transmitted from antenna 113 is accepted by a relay satellite 115 and then retransmitted to a terrestrial receiving antenna, such as earth station antenna 117. Earth station antenna 117 collects the satellite signal and provides the collected signal to a receiver 119. The receiver 119 amplifies and demodulates/detects the signal as appropriate and provides the detected signal to a decoder 121.

Decoder 121 will, essentially, reverse the process of the channel encoder 109 and recreate the data 123, which should represent a good estimate of the data 107 that had been broadcast. The decoder 121 may use Forward Error Correction (FEC), in order to correct errors in the received signal. The data 123 provided by the decoder are then provided to a formatting unit 125, which prepares the received data for use by an information sink, such as the television illustrated at 127.

Figure 2:
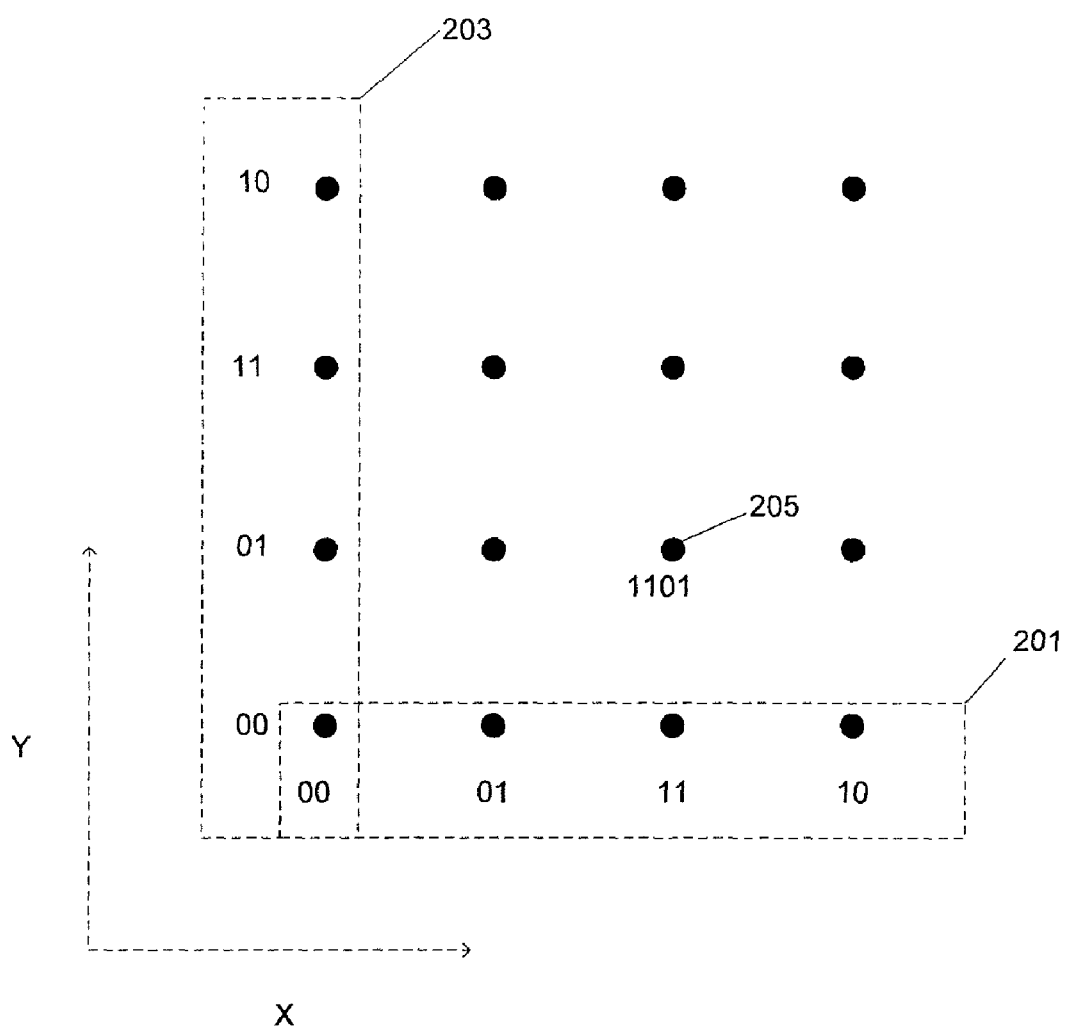
FIG. 2 is a graphical illustration of a 16 quadrature amplitude modulation (QAM) signal constellation.

FIG. 2 is a graphical illustration of a 16 QAM signal constellation. A 16 QAM signal constellation comprises 16 points which are labeled with four bits. For the sake of convenience two bits are used to label the X dimension of the constellation and an additional two bits are used to label the Y dimension of the constellation. In the X dimension points are labeled as 00, 01, 11, and 10 as illustrated at 201. The two bits 201 comprise the two most significant bits which define each point. The points in the Y dimension may be similarly labeled as shown at 203. Accordingly, for a point 205 a label is generated by reading the X dimension bits (11) first and the Y dimension bits (01) second. Point 205 thereby is assigned a value of 1101, as illustrated in FIG. 2.

Figure 3:
FIG. 3 is a graphical illustration of hard decision decoding on two channels having different signal to noise ratios.
Figure 3:
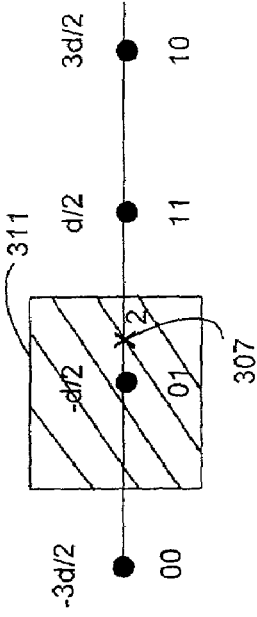
Figure 3:
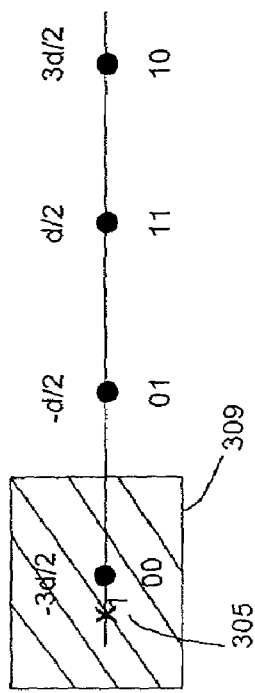

Although the methods disclosed herein are usable with any dimension signal constellation, in order to simplify the disclosure a single dimension will be illustrated. As such the examples in FIG. 3 are illustrated using the x dimension only. The analysis can, of course, be extended to any number of dimensions or points.

FIG. 3 is a graphical illustration of hard decision decoding on two subchannels having different signal to noise (SNR) ratios. In subchannel 301 the signal to noise ratio is 13 dB (decibels). In the second subchannel 302 the signal to noise ratio is 0 dB. For purposes of illustration the point $x_1$ received on subchannel 301, is illustrated at 305. The point $x_2$ received on subchannel 302, is illustrated at 307.

If simple hard decision Viterbi decoding were being employed then point 305 in subchannel 301 falls into decision region 309, marked by the crosshatched area in FIG. 3, and accordingly would be assigned a value of 00. Similarly, received point 307 in subchannel 302, which falls in decision region 311, would be assigned the value of 01.

The metrics associated with making a bit error on subchannel 301 are as illustrated in equation 1, 2, 3 and 4. Equation 1 implies that the Hamming distance D between the received point x in the most significant bit (MSB) position and zero is equal to 0. Equation 2 also implies that the Hamming distance between the received point x and a least significant bit (LSB) of 0 is also 0. Equation 3 implies that the Hamming distance between the received point x and an MSB of 1 is equal to 1. Equation 4 implies that the Hamming distance between the received point x and an LSB of 1 is equal to 1. This type of distance metric in which only the values of 1 and 0 are permitted, is referred to as Hamming metric. A Hamming metric, taken between two quantities, is 0 if the quantities are equal, and 1 if they are not equal. The equations may also equivalently be considered to be distances, with a "0" corresponding to zero distance between the postulated point and the hard decision and a "1" representing a non-zero distance between the postulated point and the hard decision point.

Similarly, with respect to subchannel 302 metric equation 5 implies that the distance between the received point x, and an MSB of 0 is equal to 0 because the hard decision is that the MSB is 0. Equation 7 implies that the distance between an MSB of 1 and the hard decision is equal to a 1 because the hard decision indicates that the MSB is not equal to a 1. Similarly, equation 6 implies that the distance between the hard decision LSB and 0 is equal to 1 (i.e. a non-zero distance).

Equation 8 implies that the distance between the received LSB and 1 is equal to 0 because the hard decision assigns a value of 1 to the LSB position.

In other words, once a hard decision is made, the metric is 0 if the hard decision matches the postulated point in metric equation and 1 if it does not. In such a manner the metrics are assigned a value of 0 or 1.

A problem with the Hamming metric approach is that the value of the metric equation is either 0 or 1 independent of the received signal strength. For the examples shown at subchannel 301, however, the likelihood of the hard decision being correct is greater than the example shown at subchannel 302. This is because in subchannel 301 the signal to noise ratio is 13 dB and the signal is much stronger relative to noise than that present in subchannel 302, and therefore more likely to be a correct value. In other words the stronger the signal relative to noise the more likely that it is correct.

Figure 5:
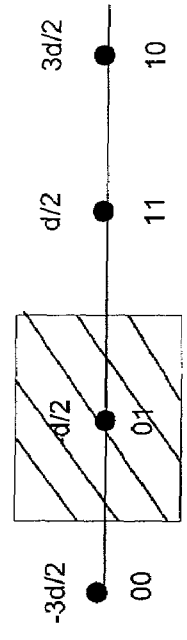
FIG. 5 is a graphical illustration of decoding with channel information.
Figure 5:
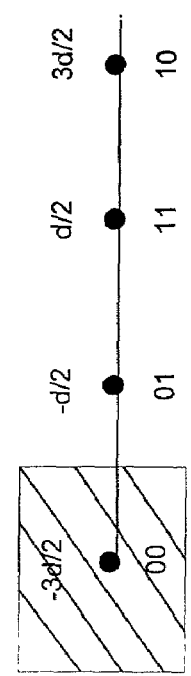

A Hamming metric, however, has no mechanism for taking the signal to noise ratio (SNR) of the channel into account. Accordingly, the Hamming metric scheme needs to be modified in order to take into account the SNR present in the channel. Such a modification would reflect that fact that a value received in subchannel 301 is more likely to be correct, because of the greater signal strength, than a value received on subchannel 302. Therefore, an error on subchannel 301 is a less likely event than an error on subchannel 302. An example of a scheme in which the signal to noise ratio (SNR) of the channel is taken to account is illustrated in FIG. 5.

Figure 3A:
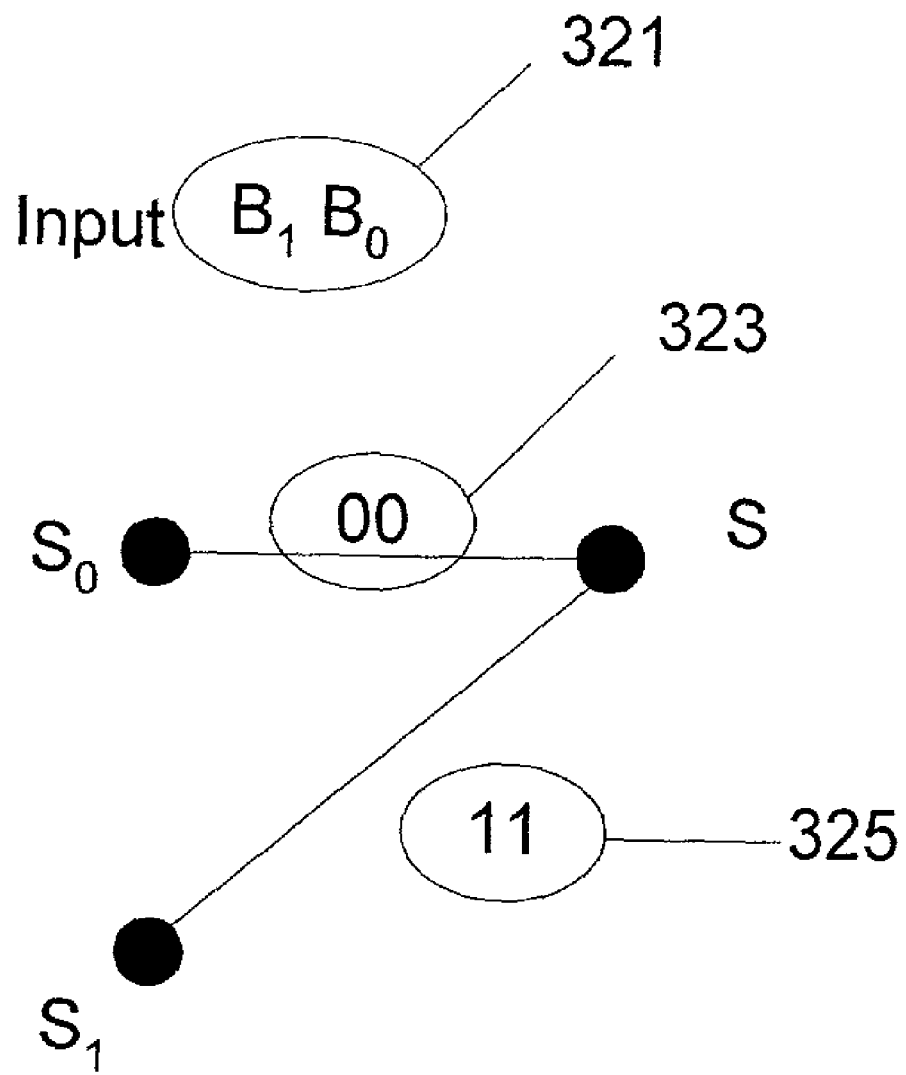
FIG. 3A is a graphical illustration of a portion of a trellis diagram illustrating a Hamming metric.

FIG. 3A is a graphical illustration of a portion of a trellis diagram illustrating a Hamming metric. In FIG. 3A state S may be entered from state $S_0$ by receiving an input bit sequence of 00 (323). State S may also be entered from state $S_1$ by receiving an input bit sequence 11 (325). Accordingly, computing the Hamming metric is straight forward. The difference between the input sequence received 321 (comprising bits $B_1$ and $B_0$) is examined on a bit by bit basis and compared to the input sequences 323 and 325, which are necessary to cause a transition into state S. Each place sequence in which sequence 321 differs from sequence 323 is assigned a value of 1. Therefore, the metric for the transition from $S_0$ into S is equal to a 0 if input bit $B_1$ is a 0 and input bit $B_0$ is a 0. The value of the metric is equal to a 1 if only one of the bits $B_1$ or $B_0$ is equal to 1. And the value of the branch metric is equal to a 2 if both bits $B_1$ and $B_0$ are 1. The higher value for the branch metric the less likely that that transition has been taken. Similarly, to compute the branch metric for a transition from state $S_1$ into state S the difference between sequence 11, i.e. 325 and the input sequence 321 is computed. If input $B_1$ and $B_0$ are both is then the input sequence matches sequence 325 and the metric is 0. If one of the input bits $B_1$ of $B_0$ is equal to a 1 then the value of the metric for a transition between state $S_1$ and S is equal to a 1. If the input sequence 321 is equal to a 00 then the branch metric for a transition between state $S_1$ and S is equal to a 2. Once the branch metrics are determined they may be used in the add compare and select mechanism of the Viterbi algorithm. Although the adding distance method of calculating branch Hamming metrics is simple, other methods may yield better decoder performance. This is so because the Hamming metrics treat every bit error as equal likely as any other bit error. The Hamming metric method does not take into account that some bits may be more reliable than others. If information is available that some bits are more reliable than others, it may be exploited in order to improve decoder performance.

Branch metrics in general represent the likelihood that a transition (i.e., branch) between states will be taken. Accordingly, the likelihood of a transition between multiple states is proportional to the product of the likelihoods of transitions linking the two end states. In other words, if a transition between a state A and a state C occurs and the most likely path between A and C is equal to A, B, C then the likelihood of transition between state A and state C is equal to the likelihood of transition between state A and state B times the likelihood of transition between state B and state C. This in essence is the reasoning behind the workings of a Viterbi decoder.

Because the likelihood of transition between states involves a multiplication of probabilities of transition through intermediate states, probabilities within a Viterbi decoder are generally expressed in logarithmic (log) terms. The probabilities within a Viterbi decoder are expressed in logarithmic terms, in general, so that instead of having to multiply transition probabilities an equivalent operation of adding logarithms of transition probabilities may be utilized. Multiplication is a complex electronic operation and by substituting an addition operation, such as the addition of logarithmic probabilities, the speed of calculations can be improved.

If P is defined as being equal to the probability of transition between states, then $$\text{Log}(P) = \text{Log } Q\left(\frac{d}{2\sigma}\right) \qquad \text{Equation 9}$$

Equation 9 represents the log of the probability of receiving a bit in error. Q is a function, described later, which will be evaluated at the value $$\left(\frac{d}{2\sigma}\right),$$

where d is the distance between two constellation points and a is the standard deviation of the noise. For purposes of the present disclosure, it is assumed that the noise is Additive White Gaussian Noise (AWGN). The Q function is the area under the tail of a Gaussian distribution, the general form of which is illustrated in FIG. 4.

Figure 4:
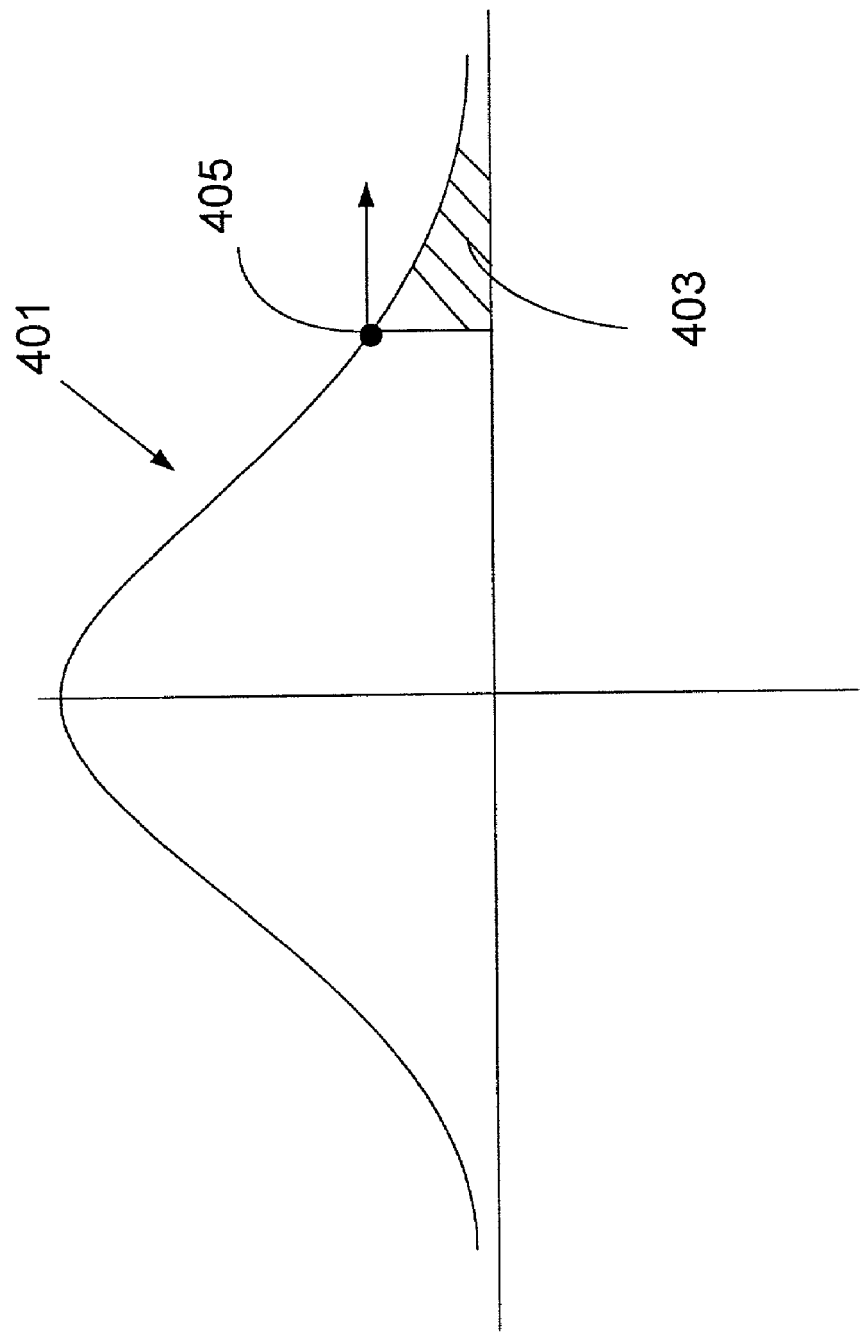
FIG. 4 is a graph of noise distribution for a channel having an Additive White Gaussian Noise (AWGN) noise distribution.

FIG. 4 is a graph of noise distribution, for a signal channel having Additive White Gaussian Noise (AWGN), illustrating the "Q" function. The Gaussian probability distribution function is shown generally at 401. The Q function, evaluated at a value, x, represents the probability that a random variable with Gaussian distribution is larger than x. The Q function, which represents the probability that the AWGN is large enough to cause a bit error, is illustrated generally at 403. The Q function gives the likelihood that a noise signal having a value greater than point 405, which is the bit threshold of error, will be present and accordingly, will cause an error in the received bit. In other words, the noise, for values larger than point 405, is so strong as to cause a bit error when added to the transmitted point. In channels where the signal is strong and the SNR high, the point 405 moves to the right, indicating that a larger noise is necessary to cause an error, and that the probability of enough noise to can cause the error is low. In channels with lower SNRs, the point 405 illustrated in FIG. 4 moves to the left indicating that a smaller noise can cause a received bit error and that the probability of enough noise to cause an error is high. By using ordinary Hamming metrics the information inherent in the location of point 405, i.e. the Q function, is unused. Equation 9 implies that the signal to noise ratio of a channel can be used to scale the branch metrics of equations 1 through 8. Such a scaling is illustrated in FIG. 5.

The signal to noise ratio of a channel allows (d/2σ) to be computed. The value of (d/2σ) allows the computation of the value of log P as in equation 9. The value for log P can be quantified to a number of bits, which may be used to determine the scaling factor for the branch metrics under given signal to noise conditions.

FIG. 5 is a graphical illustration of decoding with channel information. In FIG. 5, equation 3 and 4 of FIG. 3 have been altered to equations 3A and 4A in order to take into account channel SNR information. In equation 3A the value of the branch metric has been increased to 4 indicating that receiving an MSB that is in error is less likely because of the strong signal being provided by the channel.

Figure 6:
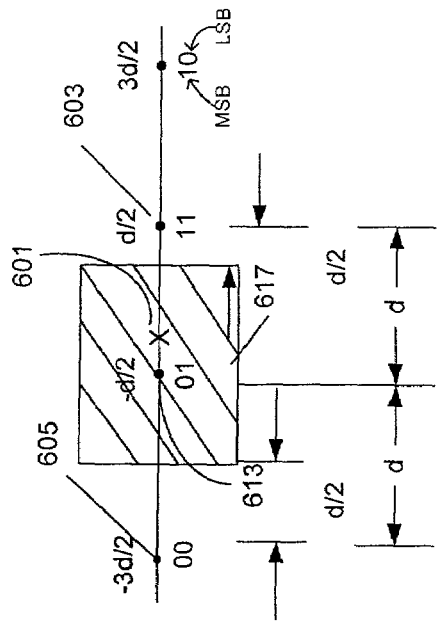
FIG. 6 is a graphical illustration of decoding with channel and location information.
Figure 6:
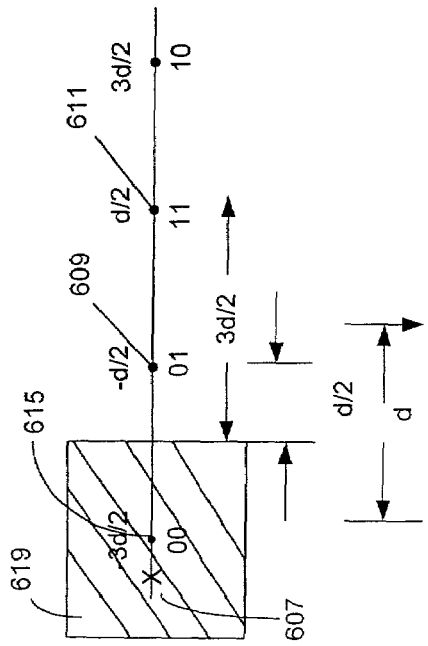

FIG. 6 is a graphical illustration of decoding with channel and location information. In order to illustrate location information consider the received point 601 in the subchannel 302 diagram. If point 601 is received it will be assigned a value of 01, that is a hard decision is being made that point 613 was transmitted. Point 613 may actually be incorrect, having an error in one or both received bits. If the most significant bit of 601 is in error then 603 was most likely sent. If 601 had an error in the LSB then 605 was most likely sent. In contrast consider point 607 in subchannel 301. Point 607 is assigned a value of 00, that is a hard decision that point 615 was transmitted is made. If in fact point 615 is in error then the LSB or the MSB of the received point 607 had to be in error. If the LSB of point 607 was in error then 609 was most likely transmitted. In contrast, however, if point 607 had an error in the MSB then 611 was most likely transmitted. As can be seen in FIG. 6, the amount of noise necessary to convert point 611 into point 607 is significantly more than the amount of noise necessary to convert point 609 into point 607. Accordingly, an error in the received bit pattern of 607 indicates that the likelihood of error is greater for the LSB than MSB. The greater probability of error in the most significant bit is reflected in branch metric equations 3B and 4B.

The metric equations therefore can be made to reflect the influence of both signal strength and location information of the received bit constellation. Metric equation 4B's value of 4 indicates the likelihood that a mistake was made in the least significant bit being received (i.e., converting a "0" to a "1") is less than the likelihood of a bit error on subchannel 302, which has a maximum metric value of 1. This reflects that fact that the signal to noise ratio on the channel is 13 dB, which is much higher than it is for subchannel 302.

The metric value for equation 3B is equal to 7 indicating both that the signal to noise ratio is higher in subchannel 301 than subchannel 302 and that in order to make an error in the most significant bit, the constellation point will deviate a greater distance than for an error in the least significant bit. This greater deviation to make a MSB error provides a greater noise immunity and hence the lessened likelihood of MSB error. The lower probability is reflected in the higher value of the metric, i.e. 7, as illustrated in Equation 3B. The higher value metrics indicate a cost of making an error. The cost is inversely proportionate to probability.

Consider subchannel 302. Point 601 is received within decision region 617 and assigned the value of 01. So if an error in the most significant bit has occurred, then, most likely point 603 was transmitted. Points 603 and 613 are separated by a distance d. Similarly, if an error is made in the least significant bit, then the point interpreted as point 613 was most likely point 605 when transmitted. Points 605 and 613 are separated by a distance d.

In contrast, consider subchannel 301 and point 615. Again the distance associated with an error in the least significant bit (i.e. between point 615 and 609), is equal to a distance d. However, if the most significant bit is in error, then the received point interpreted as 615 was probably transmitted as point 611 and had been displaced by noise a distance of 2 d in order to create the error. This type of location information may be exploited in order to weight the reliability of the received bits and the probability they are correct. Because the decisions being made are hard decisions, the Viterbi decoder only knows that a point received was given a value of 00 and nothing about where in the decision region 619 the point was located. Accordingly, the distance that will be used to compute the contribution of the location to the overall reliability of the received value is the distance from the transmitted point to the nearest edge of the decision region corresponding to the hard decision that was made.

For example, if point 609 were transmitted and a hard decision was made that point 615 was received, then point 609 must have moved into the decision region 619, i.e. a minimum distance of d/2. In contrast, the distance between point 611 and the decision region 619 is a distance of 3 d/2. Accordingly, the log probability for the LSB is equal to the Log Q(d/2σ). The log of P for the MSB is equal to the Log Q(3 d/2σ). The log probability may be used to scale the branch metrics. Therefore, as reflected in equation 4B, the metric for making an error on the least significant bit has a weight of 4. The metric for making an error on the most significant bit has a weight of 7 as illustrated in equation 3B.

By using the location information and the signal strength information an additional 1 to 2 dB of decoding margin can be realized over the case where neither is used. By knowing the construction of the signaling constellation and the signal to noise ratio, the (d/2σ) value for the channel may be calculated. The location information, given by the construction of the signaling constellation, can be used by itself or in concert with the signal to noise ratio information in order to scale branch metrics. The location information enables the addition of a scaling factor k to equation 9, that is Log P=Log Q(kd/2σ). The d/2σ portion of the equation represents the signal to noise ratio information and the k portion represents the location information. The various values of k can be precomputed and stored in a look-up table.

Figure 7:
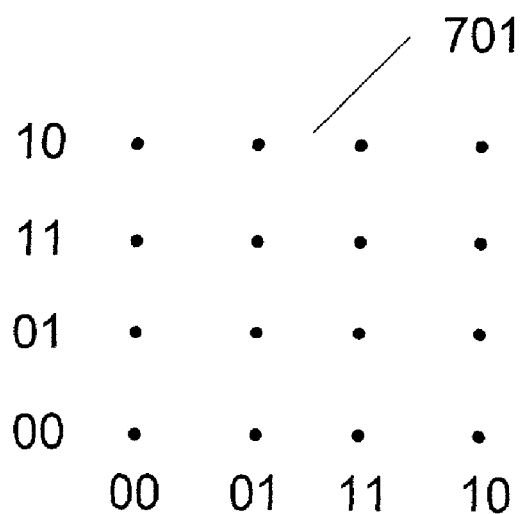
FIG. 7 is a graphical illustration of location information incorporated into a 16 QAM constellation.

FIG. 7 is a graphic illustration of location information incorporated into an exemplary 16 QAM constellation. The exemplary QAM constellation is illustrated at 701. The corresponding computed k values are illustrated in look up table 703. That is for a hard decision of 00 the $k_{MSB}$ is 3 and the $k_{LSB}$ is 1. For a hard decision of 01 the $k_{MSB}$ is equal to 1 and the $k_{LSB}$ is equal to 1. For a hard decision of 11 $k_{MSB}$ is equal to 1 and $k_{LSB}$ is equal to 1. For a hard decision of 10, $k_{MSB}$ is equal to 3 and $k_{LSB}$ is equal to 1.

Figure 8:
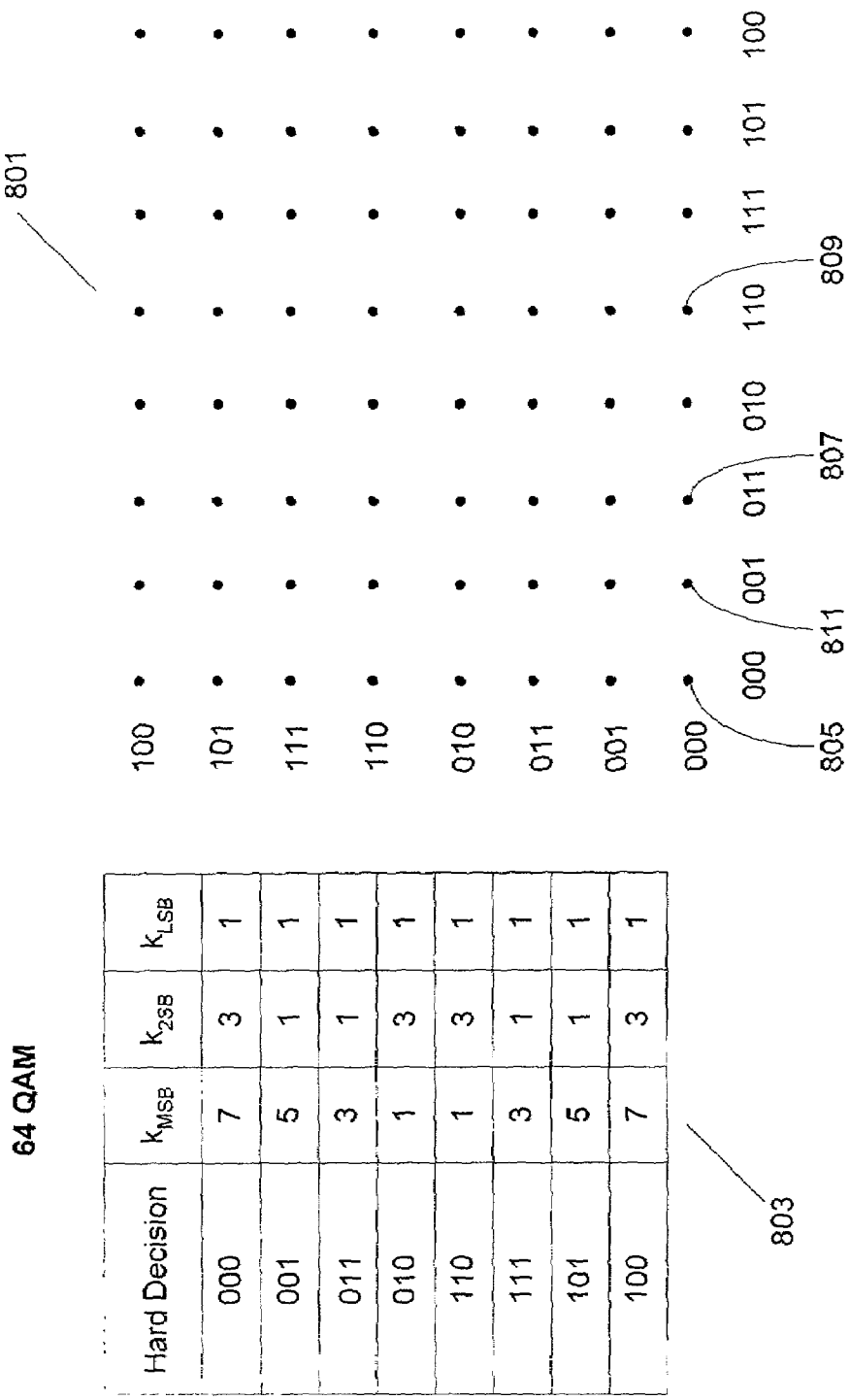
FIG. 8 is a graphical illustration of location information incorporated into a 64 QAM constellation.

FIG. 8 is a graphic illustration of location information derived from an exemplary QAM constellation 801. In FIG. 8 the exemplary 64 QAM constellation is represented generally at 801. The various values for k are illustrated in table 803. As can be seen from the table, values for k depend upon the bit position within the signal constellation, i.e. the location information, within the 64 QAM constellation 801. For example, if a hard decision is made that the received point is a 000, the weighting of the most significant bit, $k_{MSB}$, is equal to 7. In order for the MSB of point 805 to be in error, instead of point 805 being the actual point transmitted, the nearest point, in which the MSB would be a 1 instead of 0, is point 809. Likewise for the second most significant bit of point 805, the weight $k_{2sb}$ is equal to 3. If a hard decision of 000 is received and if the second most significant bit is in error, then instead of point 805 being the point that was sent, point 807 was most likely sent. The k for the least significant bit of point 805 is equal to 1 because, if an error is made in the least significant bit, instead of point 805 being sent point 811 had most likely been sent. In such a way the metrics may be modified to reflect the position within the signal constellation, with the less likely errors are weighted more heavily than the more likely errors.

The k values are assigned such that if for a point to be received in error an adjacent constellation point may have been transmitted, k is given a value of one. If the adjacent point has the same bit value and a point two constellation points away may have been transmitted to create the error, a weight of 3 is assigned, if two adjacent points have the same bit value but a point 3 constellation points away may have been transmitted to create the error, a weight of 5 is assigned, and so forth. In other words, for every additional constellation point that an error must traverse, a value of 2 is added to k.

Figure 9:
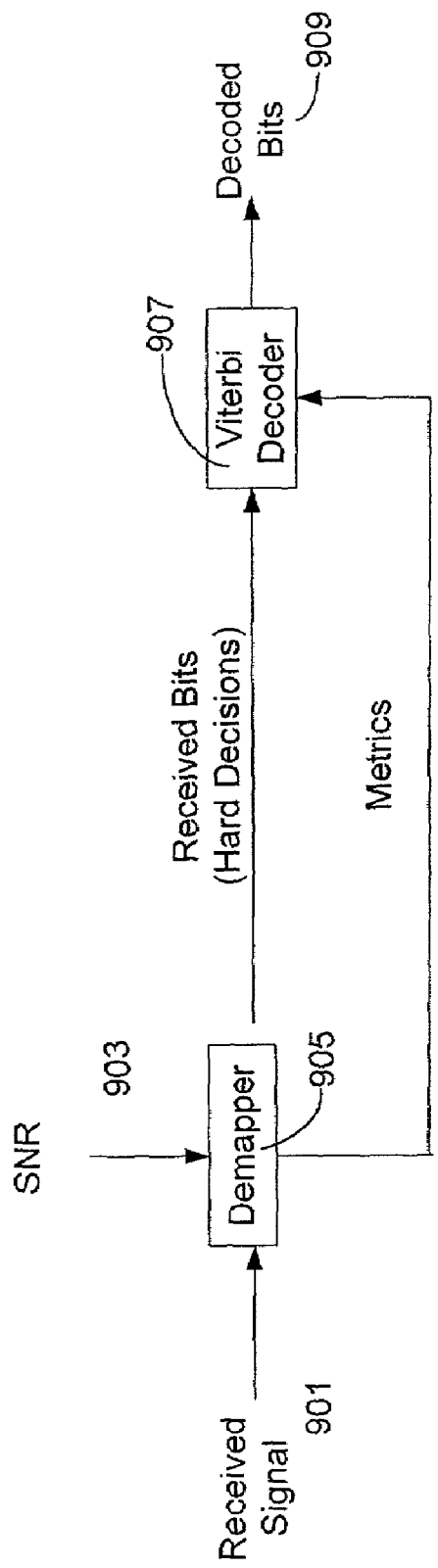
FIG. 9 is a block diagram, at a high level, of a system for Viterbi decoding with channel and location information.

FIG. 9 is a block diagram, at a high level, of a Viterbi decoder using both channel SNR and location information. In FIG. 9 demapper 905 receives an SNR value 903 and received signal point 901. The demapper 905 computes the hard decision of the point received, as well as the branch metrics (which may be obtained from a look-up table), and provides them to a Viterbi decoder 907. The Viterbi decoder then decodes the hard decisions and provides the decoded bits 909.

Figure 10:
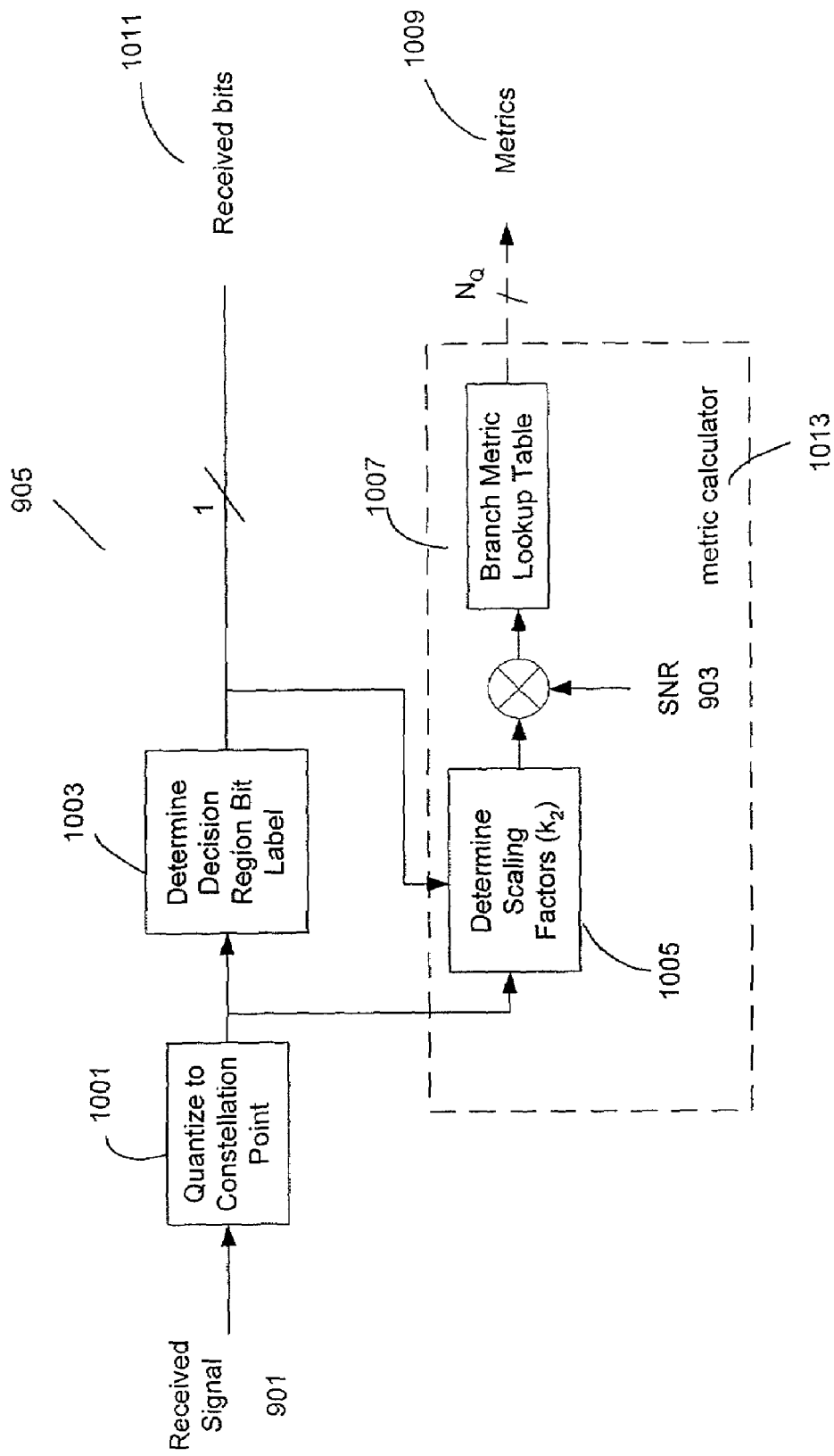
FIG. 10 is a block diagram of a demapper as illustrated in FIG. 9.

FIG. 10 is a block diagram of the demapper 905 illustrated in FIG. 9. Within the demapper, the received signal 901 is accepted by a block 1001 which decides the value of the point that was received. In other words, block 1001 locates the point, which was received, within the constellation plane. The received point is then converted to bit values in block 1003. The location information scaling factors, i.e. the k's, are determined in block 1005. Using the appropriate scaling factors from block 1005 and the signal to noise ratio 903 an appropriate branch metrics look up table is constructed 1007. The metrics 1009, along with the received bits 1011, are then provided to the Viterbi decoder illustrated in FIG. 11.

Figure 11:
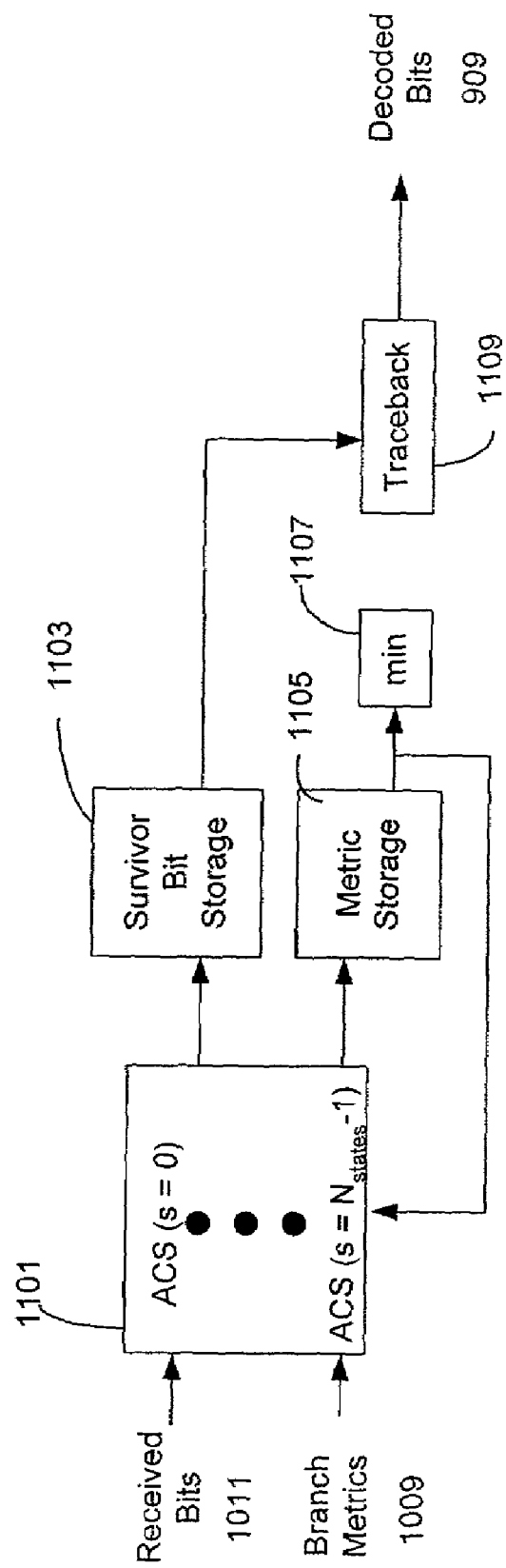
FIG. 11 is a block diagram of the Viterbi decoder as illustrated in FIG. 9.

FIG. 11 is a block diagram of the Viterbi decoder illustrated in FIG. 9. The received bits 1011 and the branch metrics 1009 are accepted into the add, compare, select unit 1101. The add, compare, select determines the most likely sequence of bits leading to state S. The survivor bits from the add compare select algorithm are then stored in survivor bit storage 1103 and the associated metrics are stored in metric storage block 1105. The minimum metric value is selected in minimum module 1107 and the survivor bits associated with the minimum metric state are then traced back in traceback unit 1109. As a result decoded bits 909 are produced.

Figure 12:
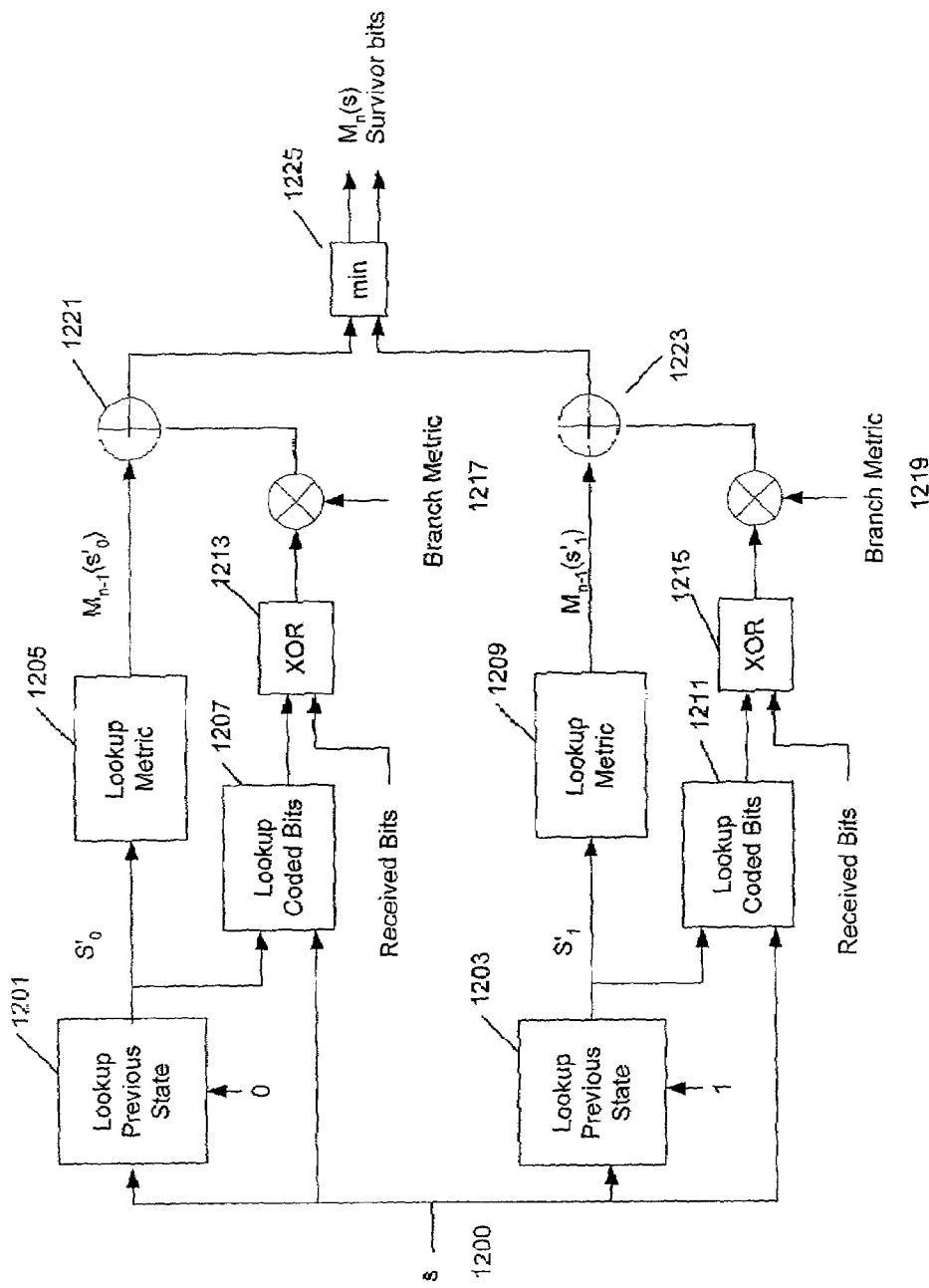
FIG. 12 is a block diagram of the design of the add, compare, select engine of FIG. 11.
Figure 13A:
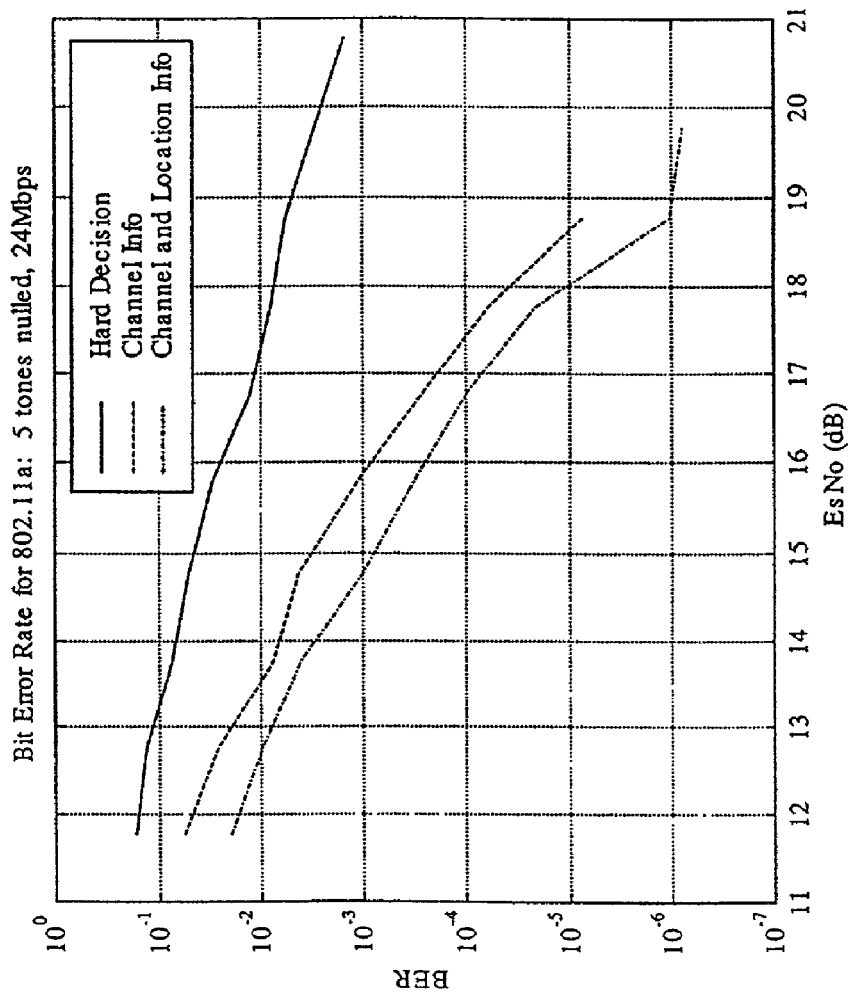
FIG. 13A is a graph comparing decoder performance in terms of bit error rate versus signal to noise ratio for hard decision, decoding with channel information, and with channel and location information.
Figure 13B:
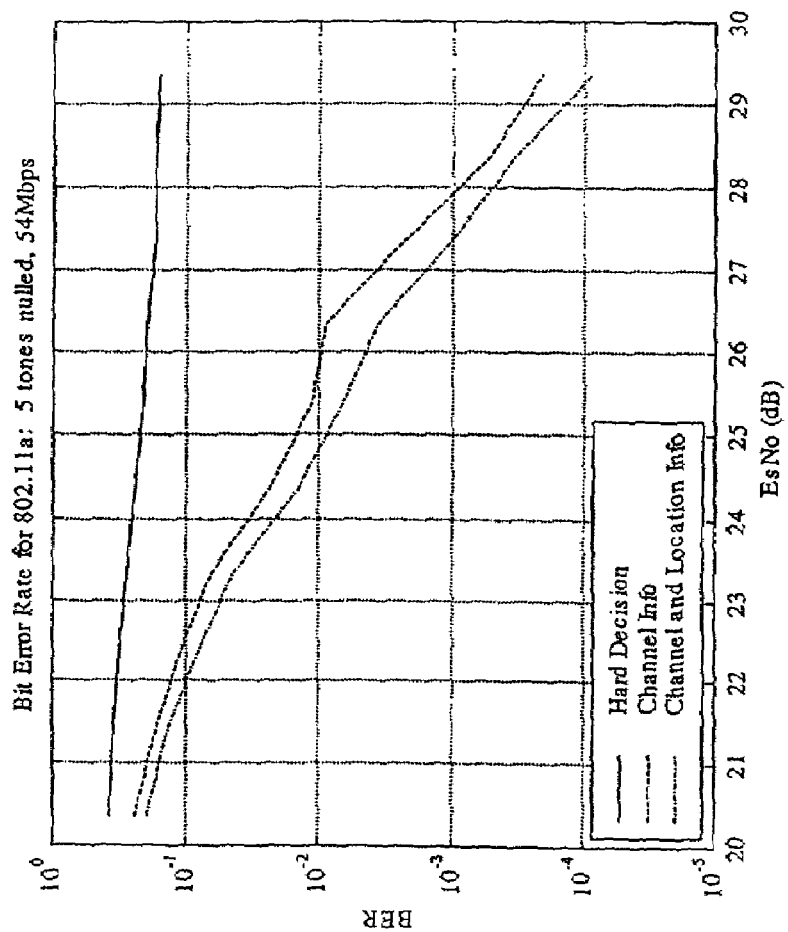
FIG. 13B is a graph comparing decoder performance in terms of bit error rate versus signal to noise ratio for hard decision, decoding with channel information, and with channel and location information.
Figure 13C:
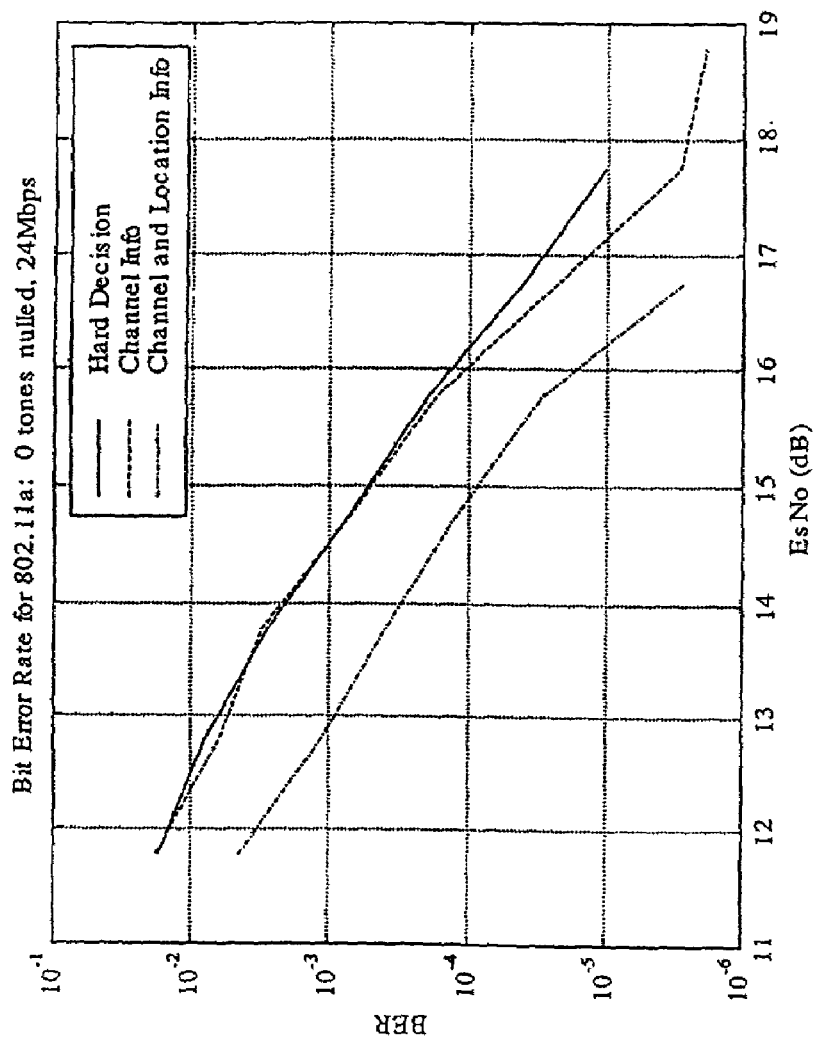
FIG. 13C is a graph comparing decoder performance in terms of bit error rate versus signal to noise ratio for hard decision, decoding with channel information, and with channel and location information.
Figure 13D:
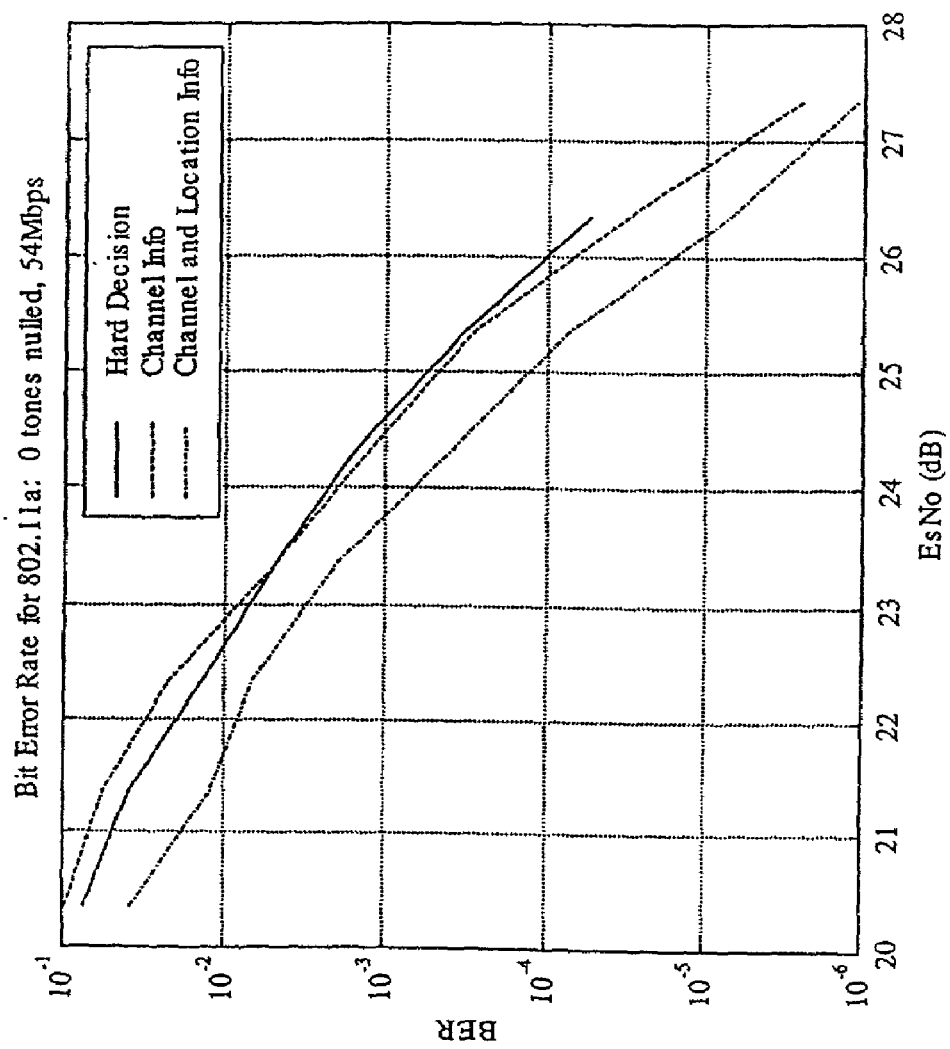
FIG. 13D is a graph comparing decoder performance in terms of bit error rate versus signal to noise ratio for hard decision, decoding with channel information, and with channel and location information.

FIG. 12 is a block diagram of the design of the add, compare, select engine of FIG. 11. Within the add, compare, select engine a particular state S, i.e., 1200, is accepted. Within the add, compare, select engine 1101, a state previous to 1200, is looked up in block 1201 and block 1203. Block 1201 looks up the previous state indexed by 0 and block 1203 looks up a previous state indexed by 1. Block 1201 determines the previous state associated with the 0 path and block 1203 determines the previous state associated with the 1 path. Once the previous state $S_0$ in the case of block 1201 and $S_1$ in the case of block 1203 is determined, the particular metric of that state is looked up in block 1205 and 1209. In block 1207 and 1211 the bits associated with the particular branch comprising the transition into state S, 1200, are looked up. The bits looked up are then compared to the received bits in exclusive OR blocks 1213 and 1215. If the received bits match the look up coded bits then no metric is accumulated in block 1213 or 1215. If the received bits do not match, then the exclusive OR 1213 or 1215 will be equal to a 1. The points that do not match are then multiplied by the branch metric 1217 or 1219. In the case where the bits do not match the branch metric will be multiplied by a 1, which is the output of exclusive OR 1213 or 1215, and then added to the metric to the previous state in either block 1221 or 1223. The metrics computed in 1221 and 1223 are then compared in a block 1225 which then selects the minimum value representing the correct survivor bit and the correct survivor metric.

FIGS. 13A through 13D are graphs comparing decoder performance in terms of bit error rate versus signal to noise ratio for hard decision, decoding with channel information, and with channel and location information. The solid line represents hard decisions using Hamming metrics. The dashed line represents to improvement grained through the use of channel information. The line with dashes and dots represents the improvement gained through the use of location information.

What is claimed is:

1. A method for Viterbi decoding comprising:
   receiving a sampled signal;
   making a hard decision on which constellation point the sampled signal represents thereby creating a hard decision point;
   determining a scaling factor (k) corresponding to the hard decision point; and
   providing the scaling factor (k) and the hard decision to a Viterbi decoder,
   wherein determining a scaling factor (k) corresponding to the hard decision point comprises:
   selecting a first constellation point corresponding to the hard decision point;
   determining a second constellation point corresponding to a nearest constellation point having a designated received bit; and
   assigning a scaling factor value dependent on the number of constellation points between the first constellation point and the second constellation point.

2. The method as in claim 1 wherein making a hard decision on which constellation point the sampled signal represents comprises choosing a constellation point which is the closest Euclidean distance to the received sample signal.

3. The method as in claim 1 wherein comparing the designated received bit to the hard decision to compute the scaling factor comprises reading the scaling factor from a look up table.

4. The method of claim 3 wherein reading the scaling factor from a look up table further comprises:
   using the designated received bit and the hard decision to index into a look up table; and
   reading the scaling factor from the look up table.

5. The method as in claim 1 wherein comparing the designated received bit to the hard decision to compute the scaling factor comprises:
   selecting a transition for which the scaling factor will be determined, thereby determining a selected transition;
   determining the designated received bit that will result in the selected transition; and
   comparing the designated received bit to the hard decision to compute the scaling factor.

6. The method of claim 5 wherein assigning a scaling factor dependent on the number of constellation points between the first constellation point and the second constellation point comprises:
   assigning a value of zero to the scaling factor if the first constellation point is equal to the second constellation point;
   assigning a value of 1 if the first constellation point is adjacent to the second constellation point; and
   assigning a value of 2N+1 if the first constellation point is separated from the second constellation point by N constellation points.

7. The method as in claim 1 wherein determining a scaling factor (k) corresponding to the hard decision point further comprises:

determining a first scaling factor dependent on a location information of the hard decision;

determining a second scaling factor dependent on a signal to noise ratio of the channel; and combining the first scaling factor with the second scaling factor to produce the scaling factor k.

8. The method of claim 7 wherein the means for determining the scaling factor (k) corresponding to the hard decision point further comprises:

means for determining a first scaling factor dependent on a location information of the hard decision;

means for determining a second scaling factor dependent on a signal to noise ratio of the channel; and means for multiplying the first scaling factor to the second scaling factor to produce the sealing factor (k).

9. An apparatus for decoding a signal, the apparatus comprising:

means for receiving a sampled signal;

means for making a hard decision on which constellation point the sampled signal represents;

means for determining a scaling factor (k) corresponding to the hard decision points; and means for providing the scaling factor (k) and the hard decision to a Viterbi decoder, wherein determining a scaling factor (k) corresponding to the hard decision point comprises:

selecting a first constellation point corresponding to the hard decision point;

determining a second constellation point corresponding to a nearest constellation point having a designated received bit; and assigning a scaling factor value dependent on the number of constellation points between the first constellation point and the second constellation point.

10. A method of signal decoding comprising:

accepting a received signal;

quantizing the received signal to a point in a signal constellation plane, to provide a quantized point;

making a hard decision as to which constellation point the quantized point represents;

determining scaling factors (k's) associated with each constellation point;

using the scaling factors and hard decision point to determine decoder metrics; and providing a decoder metrics and quantized point to a Viterbi decoder.

11. The method of claim 10 wherein making a hard decision as to which constellation point the quantized point represents comprises:

determining which constellation point is closest to the quantized point; and assigning a value of nearest constellation point to the quantized point.

12. The method of claim 11 wherein determining which constellation point is closest to the quantized point comprises:

computing a Euclidean distance squared between the quantized point and a candidate constellation point; and selecting the constellation point with a smallest Euclidean distance squared as the closest constellation point.

13. The method as in claim 12 wherein selecting the constellation point with a smallest Euclidean distance squared comprises:

(a) squaring an X direction distance between the quantized point and the candidate constellation point to provide a squared X direction distance;

(b) squaring a Y direction distance between the quantized point and the candidate constellation point to provide a squared Y direction distance;

(c) adding the squared X direction distance to the squared Y direction distance to find a Euclidean distance squared;

(d) repeating steps a, b and c for all candidate points;

(e) selecting the candidate point with a smallest Euclidean distance squared.

14. The method as in claim 10 wherein determining the scaling factors associated with each quantized point comprises:

determining an amount of noise necessary to create an error in a candidate bit; and assigning the scaling factor in proportion to the amount of noise necessary to create an error in a candidate bit.

15. The method of claim 10 further comprising:

multiplying the scaling factors times a signal to noise ratio (SNR) scaling factor to provide a scaled SNR result; and using the scaled SNR result to determine the decoder metrics.

16. The method of claim 15 wherein using the scaled SNR result to determine the decoder metrics comprises:

using the results as an index into a branch metric table; and reading the metric associated with the index.

17. An apparatus comprising:

an input for accepting a received signal;

a quantizer that accepts the received signal from the input and quantizes the input to a point in a signal constellation plane, to provide a quantized point;

a hard decision unit that accepts the quantized point and determines a constellation point that the quantized point represents;

a scaling factor unit that determines scaling factors associated with the constellation point; and a metric calculator that accepts the scaling factors and the constellation point and determines branch metrics for the constellation point.

18. An apparatus of claim 17 further comprising:

a Viterbi decoder that accepts the constellation points and the branch metrics and produces decoded bits.

19. The apparatus of claim 17 wherein the metric calculator comprises:

an input that accepts a signal to noise ratio (SNR);

an input that accepts scaling factors; and a combination circuit that combines the scaling factors and SNR to create a branch metric.

* * * * *